United States Patent [19]

Borrello et al.

[11] Patent Number: 4,956,686
[45] Date of Patent: Sep. 11, 1990

[54] TWO COLOR INFRARED FOCAL PLANE ARRAY

[75] Inventors: Sebastian R. Borrello, Dallas; Charles G. Roberts, McKinney, both of Tex.

[73] Assignee: Texas Instruments Incorporated, Dallas, Tex.

[21] Appl. No.: 21,373

[22] Filed: Mar. 3, 1987

Related U.S. Application Data

[63] Continuation of Ser. No. 827,207, Feb. 4, 1986, abandoned, which is a continuation of Ser. No. 65,499, Apr. 30, 1984, abandoned.

[51] Int. Cl.$^5$ ............................................. H01L 27/14
[52] U.S. Cl. ........................................ 357/30; 357/32; 357/16
[58] Field of Search ...................... 357/31, 32, 45, 41, 357/16, 22 LA, 24 LR, 30 B, 30 A, 30 D, 30 G, 30 H, 30 I, 30 VS, 30 B, 30 H, 30 D, 30 E, 30 Q, 30 , 30 P

[56] References Cited

U.S. PATENT DOCUMENTS

| | | | |
|---|---|---|---|
| 3,617,753 | 11/1971 | Kato et al. | 347/31 X |
| 4,211,586 | 7/1980 | Fang et al. | 357/17 X |
| 4,380,755 | 4/1983 | Endlicher et al. | 357/30 X |
| 4,429,330 | 1/1984 | Chapman | 357/24 LR X |

FOREIGN PATENT DOCUMENTS 1444542  8/1976  United Kingdom .......... 357/22 LA

OTHER PUBLICATIONS

Schoolar et al., "Multispectral PbS$_x$Se$_{i-x}$ and Pb$_y$Sn$_{i-x}$Se Photovoltaic Infrared Detectors," *Infrared Physics*, vol. 20, No. 4, Jul. 1980, pp. 271-275.

Forbes, "Characteristics of the Inbium-Doped Infrared Sensing MOSFET (IRFET)", *IEEE Transaction on Electron Devices*, vol. Ed-23, No. 12, Dec. 1976, pp. 1272-1278.

Verie et al., "Cd$_x$Hg$_{1-x}$Te Infrared Photovoltaic Detectors," *Applied Physics Letters*, vol. 10, No. 9, 1 May 1967, pp. 241-243.

Williams et al., "n-Channel M. I. S. F. E. T. S in Epitaxial HgCdTe/CdTe," *Electronics Letters*, vol. 16, No. 22, (23 Oct. 1980), pp. 839-840.

Pawlikowski et al., "Some Properties of Photovoltaic Cd$_x$Hg$_{1-x}$TE Detectors for Infrared Radiation," *Infrared Physics*, vol. 15, No. 4, Nov. 1975, pp. 331-337.

*Primary Examiner*—William Mintel
*Attorney, Agent, or Firm*—James T. Comfort; Melvin Sharp; Carlton H. Hoel

[57] ABSTRACT

An infrared detector in the form of a focal plane array containing infrared detectors of two sensitivity types is disclosed. The detectors may be based on alloys of HgCdTe with cutoff wavelengths of 5 microns and 10 microns. The two types of detectors are in close proximity and thereby avoid the time delay problem. The two spectral sensitivities make possible the determinaton of spectral signatures and target identification. Further, the two types of detectors are arrayed to permit use of a single set of read lines together with electronic addressing for selecting the detector type, thereby simplifying the output structure and processor design.

13 Claims, 9 Drawing Sheets

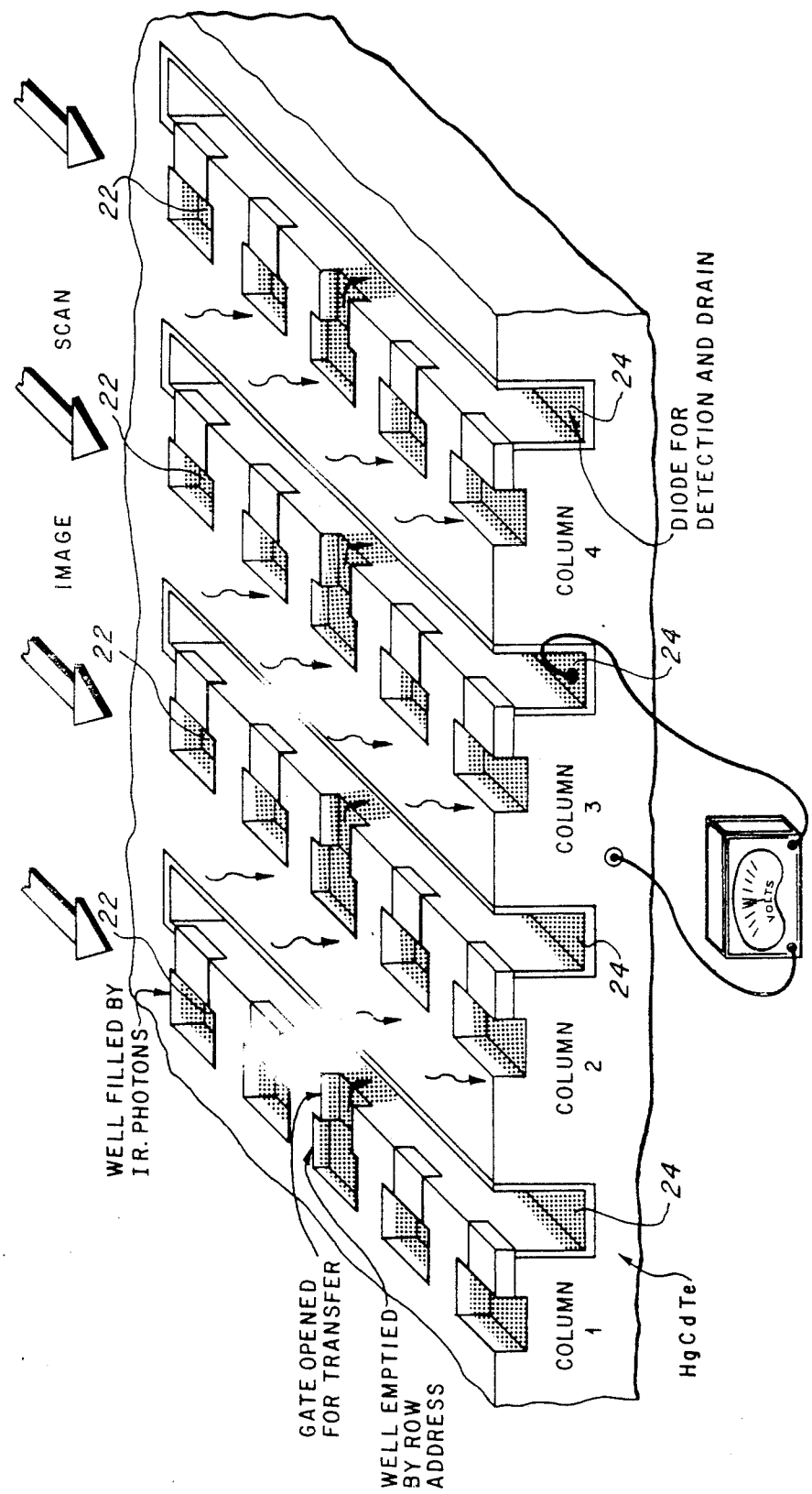

TWO COLOR INFRARED FOCAL PLANE ARRAY

This application is a continuation of application Ser. No. 827,207, filed Feb. 4, 1986, which is a continuation of Ser. No. 605,499 filed Apr. 30, 1984, both now abandoned.

BACKGROUND OF THE INVENTION

This invention relates to infrared imagers, and, more particularly, to imagers in the form of focal plane arrays of detectors of two types with different infrared spectral sensitivities.

Infrared imagers in the form of infrared focal plane arrays have numerous applications such as space object identification, missile guidance, and thermal imagers. There are many different technologies for fabricating two dimensional infrared focal plane arrays and many ways of extracting the detection information. The most common approach is to use a monolithic array of photodiode fabricated on a narrow band gap semiconductor and connect this to silicon integrated multiplexing circuitry. Alloys of mercury, cadmium and tellurium are frequently used to fabricate the narrow band gap semiconductor because of the ability to select the band gap by merely specifying the proportions of mercury to cadmium. Indeed, HgTe is a semimetal and CdTe has a band gap of about 1.5 eV, and alloys of the two show a continuous variation in band gap.

For example, $Hg_{.8}Cd_{.2}Te$ is commonly called 14 micron HgCdTe because it has a band gap approximately equal to the energy of a photon having a wavelength of 14 microns. See, generally, Wolfe and Zissis, Eds. The Infrared Handbook, ch. 11 (1978). Various methods of fabrication of alloys of mercury, cadmium and tellurium are known; for example, Castro, U.S. Pat. No. 4,374,678 discloses a laser-based selective interdiffusion process.

The integrated multiplexing circuitry is commonly a charge coupled device with the frontal currents generated in the photodiode array being injected into the CCD during a stare time, followed by the accumulated charge being clocked out of the CCD between stare time intervals. Alternatively, the photocurrent generated in the photo-diode array can be sampled and amplified by a low impedance current integrator. See, generally, Wolfe and Zissis, Eds., The Infrared Handbook, ch. 12 (1978).

However, the performance of such infrared detectors is limited because they are not capable of infrared spectral discrimination; that is, they only see one color. Detection of two or more colors, that is, two or more infrared spectral regions, will allow easier analysis of the target being viewed because the spectral signature (emissivity versus wavelength) can be determined. This will allow discrimination between targets that would appear identical for a one color detector.

Previous two color detectors were basically brute force type adaptations of one color detectors. For example, merely inserting a filter in front of a long wavelength detector (small bandgap semiconductor used to fabricate the photodiodes) will simulate a short wavelength detector; and alternately applying and removing the filter will give a sequence of two color detections. This filter modification method has the obvious problems associated with moving the filter around, reliability of filter mounting method due to the proximity to and low temperature of the detector, and also the problem of a decrease in sensitivity of the detector due to the lower efficiency of a small bandgap semiconductor being limited to detection of only higher energy photons.

Another two color approach is to simply bond, in an alternating fashion, small detectors of two different types to a common carrier. A problem with this common carrier approach is the physical size of the detectors being bonded onto the carrier; for example, if the individual detectors were on the order of a few millimeters in length and width, then the array formed on the common carrier would be like a checkerboard with each of the squares a few millimeters on a side. In addition to the obvious lack of resolution, any time delay due to scanning would make detection of moving targets unreliable.

Monolithic structures with photodiodes of two or more infrared color sensitivity have been reported. Barrowcliff and Wood, Integrated Multicolor Detector Structure, Meeting of the Iris Specialty Group on Infrared Detectors (Jun. 12–13, 1979) formed photodiodes of $InAs_{.87}Sb_{.13}$ and $Ga_{.97}In_{.03}Sb$ on GaSb substrates by selective etching and liquid phase epitaxial growth, followed by polishing and ion implantation of Be. Similarly, Chu, Bouley and Black, Performance of Multispectral Response Lead Salt Infrared Detectors, 409 Proceedings of the SPIE—the International Society for Optical Engineering 89 (Apr. 5–6, 1983) reported epitaxial growth of multilayers of p-type PbS $PbS_{.5}Se_{.5}$ and PbSe and formed Pb metal Schottky contacts. These metallic lead-lead salt diodes show multispectral response in the infrared. A further problem, however, with all of the foregoing two color detectors and focal plane arrays is the complexity of two sets of connections and circuitry for extracting the two color information. Moreover, this previous art is restricted to wavelength less than 6 microns which excludes the useful atmospheric window between 8 and 12 micron wavelength.

SUMMARY OF THE INVENTION

This invention provides a monolithic dual-spectral (two color) focal plane array with charge imaging matrix architecture for small sized detectors with the two colors' detectors interleaved and with a single set of readout lines for both colors. Electronic addressing selects the color to be read and therefore the color multiplexing is simply done on the detector chip as opposed to the prior art's cumbersome separate read outs with multiplexing done in the off chip processor. For two color infrared detection, two HgCdTe alloys are epitaxially grown to provide the basis for the two color detectors, and the readout lines are diode lines formed in the HgCdTe. The diodes provide low noise read out.

Thus the problems of sensitivity, proximity of the two color detectors, and complicated information readout are solved by the present invention.

BRIEF DESCRIPTION OF THE DRAWINGS

FIGS. 4a and 4b illustrate an equi-potential surface interconnect to a processor;

DETAILED DESCRIPTION OF THE PREFERRED EMBODIMENTS

A preferred embodiment of the inventive two color infrared focal plane array will now be described; first an indication of how to fabricate the first embodiment array will be given and this will be followed by a description of its operation.

Figure 1:
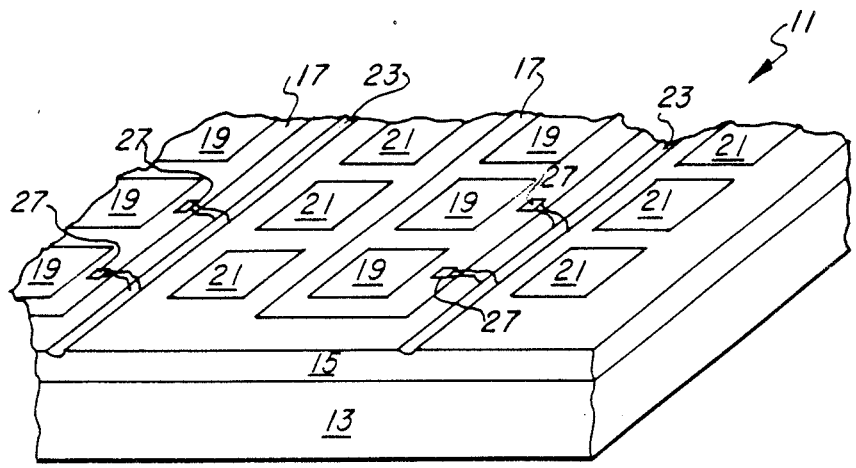
FIG. 1 is a schematic perspective view of a portion of a partially fabricated preferred embodiment array.

FIG. 1 shows a partially-fabricated first embodiment array, generally designated 11, in a schematic format. Array 11 includes a CdTe substrate 13, which may be approximately 0.4 mm thick for strength and of a length and width depending upon the size of array 11 although 10 mm is expected to be typical. Layer 15 of $Hg_{.73}Cd_{.27}Te$ has been epitaxially grown on substrate 13. Regions 17 in layer 15 are $Hg_{.78}Cd_{.22}Te$ which have been epitaxially grown in slots in layer 15, as will be described. Note that $Hg_{.73}Cd_{.27}Te$ absorbs photons with wavelengths of less than or approximately equal to five microns and thus is commonly called five micron HgCdTe and that $Hg_{.78}Cd_{.22}Te$ absorbs photons of wavelength less than or approximately equal to ten microns and, similarly, is called ten micron HgCdTe. Also, all figures and estimates of performance are at about 770 K, the normal operating temperature for mercury cadmium telluride infrared detectors. FIG. 1 also shows the individual detector gates 19 and 21 and the corresponding diodes 27 and diode read lines 23 of array 11. Note that one diode read line 23 serves both a column of detector gates 21 and a column of detector gates 19. As described in greater detail below, detector gates 19 are transparent metallizations on a thin insulating layer grown on the ten micron HgCdTe layer 17, and the detector gates 21 are similar metallizations on an insulating layer grown on the five micron HgCdTe layer 15. Each of detector gates 19 and 21 forms an MIS capacitor with the underlying HgCdTe and, when biased, accumulates charge generated by absorption of infrared photons in the HgCdTe near the detector gate. This charge is then read off by diode lines 23.

FIG. 2 shows a method of fabricating layer 15 and regions 17 on substrate 13. The integrity of the epi-substrate interface is not crucial in this embodiment because array 11 uses MIS type detectors which are surface mode detectors. As shown in FIG. 2(a), substrate 13 is initially patterned and slot 25 etched to a depth of approximately ten microns; alternatively, these slots could be milled. Next, FIG. 2(b), layer 15 of five micron HgCdTe is epitaxially grown on the slotted surface of substrate 13 by liquid phase epitaxy. Layer 15 is P-type with a carrier concentration at 770 K of about $1E15/cm^3$, although concentrations in the range of from 1E14 to 2E15 should provide adequate performance. Layer 15 is grown to a depth of about 12 microns completely filling slots 25, which takes about 30 minutes from a melt that is slowly cooled (0.02° to 0.05° C. per minute). As shown in FIG. 2(c) layer 16 of ten micron HgCdTe is grown on layer 15 to a depth completely filling the images of slot 25 in layer 15. Layer 16 is also grown by liquid phase epitaxy and is also of P-type material with a somewhat lower carrier concentration as layer 15. Lastly, layer 16 is polished to remove the raised portions and expose layer 15 everywhere except over slots 25 where regions 17 have appeared as the residue of layer 16; See FIG. 2(d). The resulting planar two color substrate is generally denoted by 18.

Figure 3:
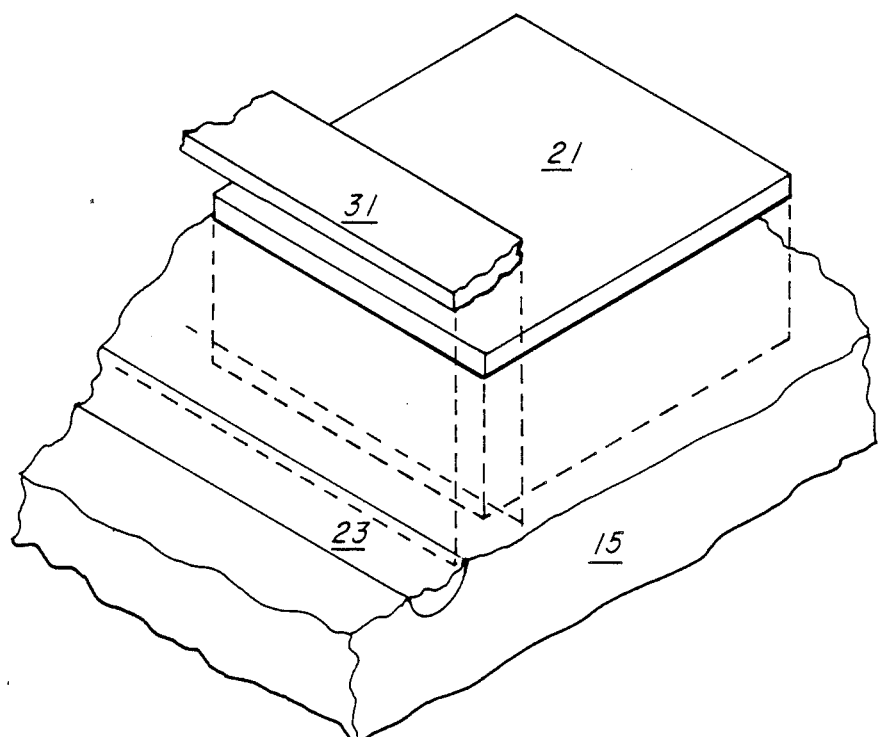
FIG. 3 is a simplified perspective view of a single detector of the array.
Figure 2A:
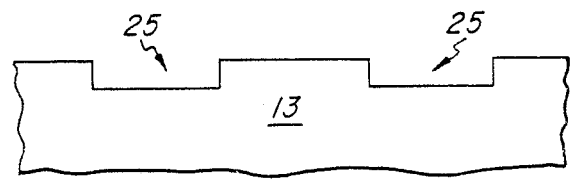
FIG. 2 shows the steps for growing the two color substrate for the array.
Figure 2B:
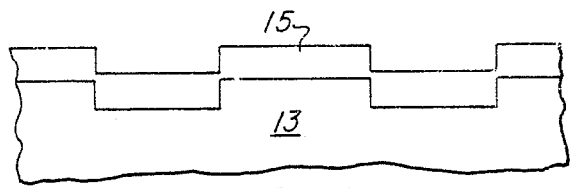
Figure 2C:
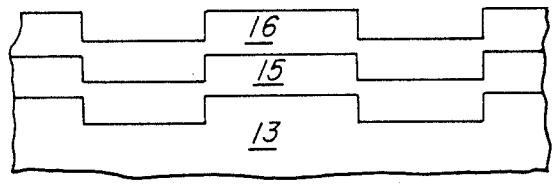
Figure 2D:
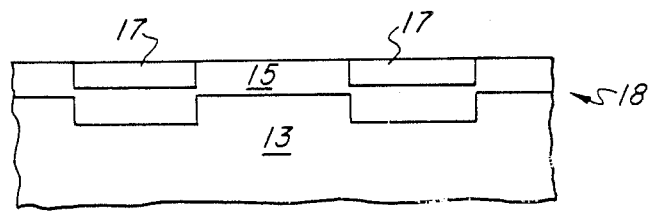

Array 11 operates as a charge imaging matrix (CIM) which is formed on the just described two color HgCdTe substrate 18 as a two dimensional matrix of detectors. Each detector consists of three structures: an MIS detector region covered with a metal detector gate (19, 21), a diode (23, 27) which serves as a column-output node for charge collected in the MIS detector region, and a transfer gate (29, 31) which isolates the detector region from the diode drain and is dc-biased to slight depletion so that collected charge can be transferred from the detector region to the diode; FIG. 1 shows the matrix arrangement, and FIG. 3 shows a simplified perspective view of a single detector in the five micron HgCdTe layer 15. It is understood that insulating material fills the spaces between layer 15, diode 23, detector gate 21, and transfer gate 31. Prior to considering a detailed description of the fabrication and operation of the CIM, a simplified description will be helpful.

The CIM is operated by charging each detector gate with an applied bias voltage to generate a potential well at the surface of the HgCdTe. FIG. 4A illustrates a multi-potential surface for electrons with a positive bias applied to detection gate 21; recall that HgCdTe layer 15 is P-type and so diode 23 is N-type and note that for simplicity only an array of one color detectors' potentials is shown. Wells 22 correspond to detector gate 21, and troughs 24 correspond to diode lines 23. Photons absorbed in and near a detector gate 21 by HgCdTe layer 15 will generate electron-hole pairs, and the electrons will collect in the potential well 22. After an integration time, detector gates 21 of the selected row of the CIM that is to be read are discharged. This collapses the corresponding potential wells and the collected electrons are transferred to diodes 23, as schematically illustrated in FIG. 4A. This CIM is a five row, four column matrix with all of the potential wells integrating the photon-generated electrons. Row 3 has been addressed with the charge spilling into each diode column from the collapsing potential wells of row 3, this charge changing the floating diode 23 potential. The voltmeter is a pictorial representation of a silicon integrated circuit processor. The row bus electrodes (not shown) connecting the detector gates 21 provide means to address each row of detectors sequentially and, with the parallel column diode outputs, the collected charge at each detector is sensed. In this way the CIM performs the function of infrared detection (each detector creating a pixel of the imager), charge integration, sequential or random pixel address, charge to voltage conversion and extraction of charge from the array. Charge extraction results in greatly reduced cross talk, noise, and elimination of the potential capacity reduction associated with charge injection devices (CID) operating at high data rates.

Figure 4B:
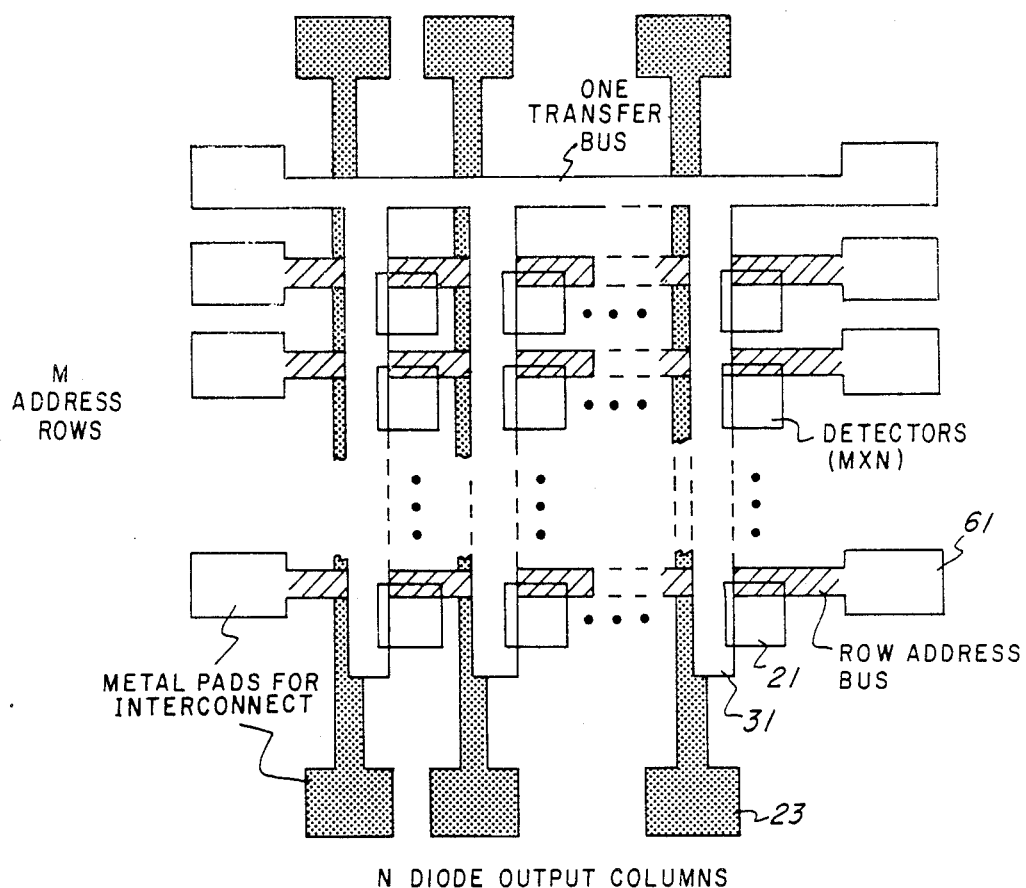

FIG. 4B shows a plan view of a simplified one-color array with pads for interconnection to a processor.

Figure 5:
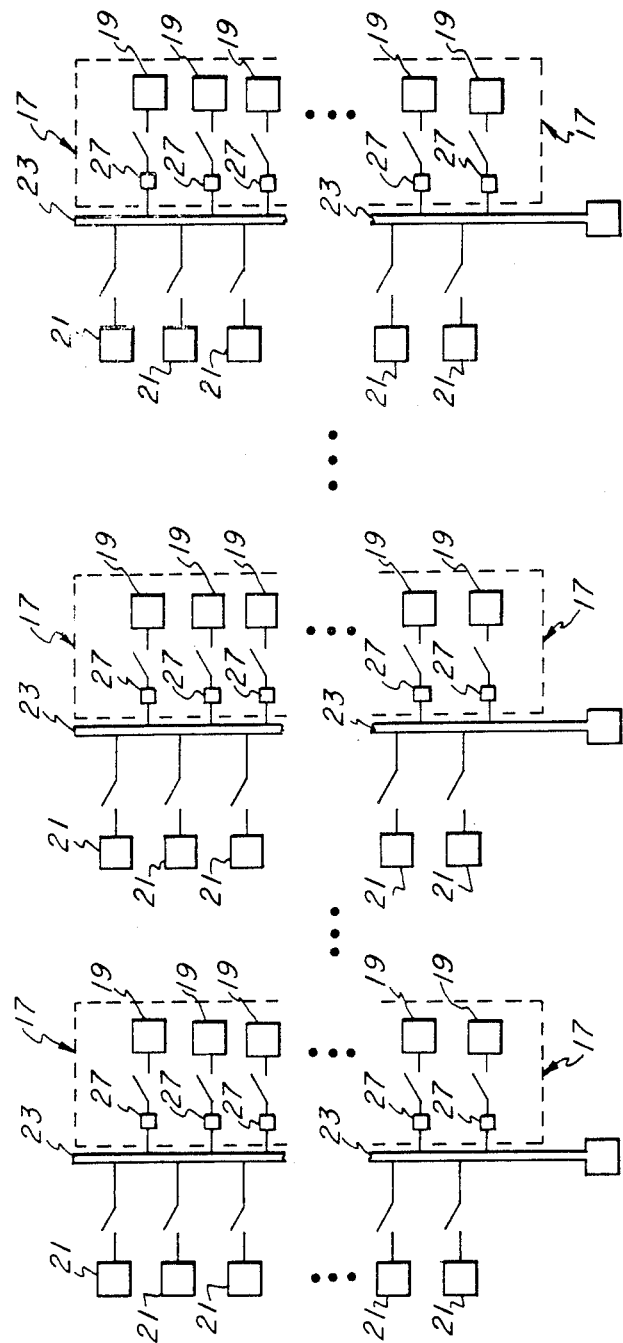
FIG. 5 schematically shows the two color operation of the array.

FIG. 5 schematically shows the two color operation of array 11. Note that the row addressing of the detector gates 19 and 21 for control of the underlying potential wells is illustrated by the open switches which are tied together in rows. Diodes 27 in the ten micron HgCdTe regions 17 are small and connected to diode lines 23 which are formed in the five micron HgCdTe. This gives the advantage of a very small leakage current in the ten micron HgCdTe, since the ten micron material is more sensitive to dark current and limited charge capacity in the detectors.

Figure 6A:
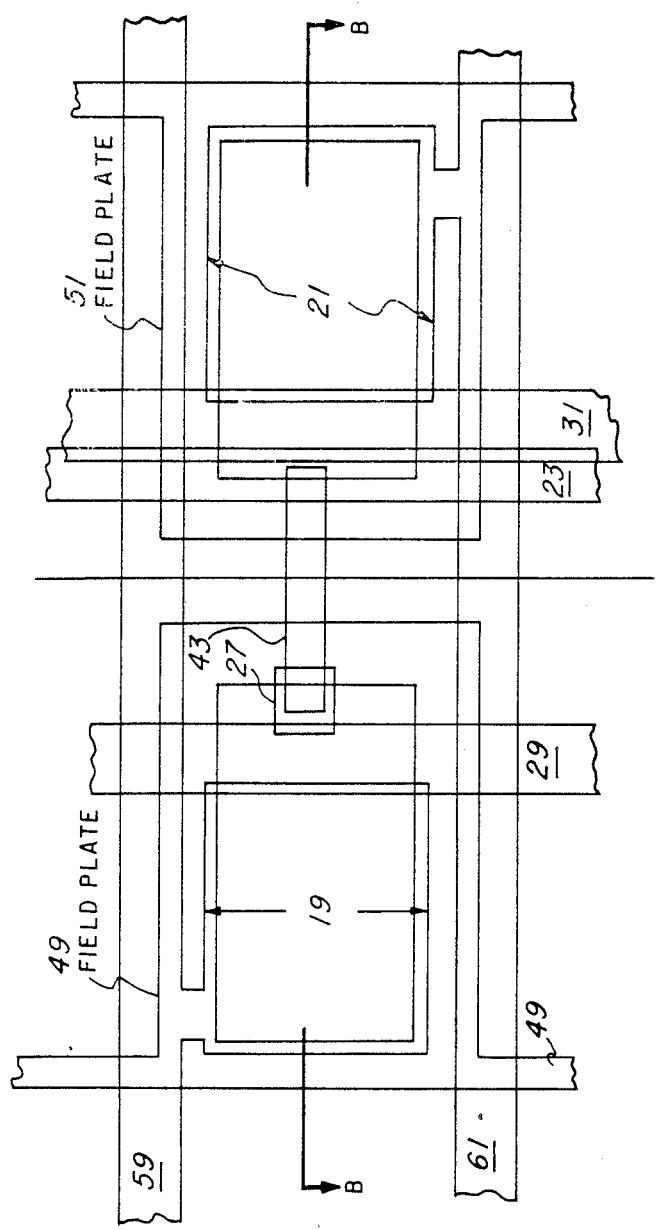
FIGS. 6a and 6b are plan and elevation views of a pair of detectors of the array.
Figure 6B:
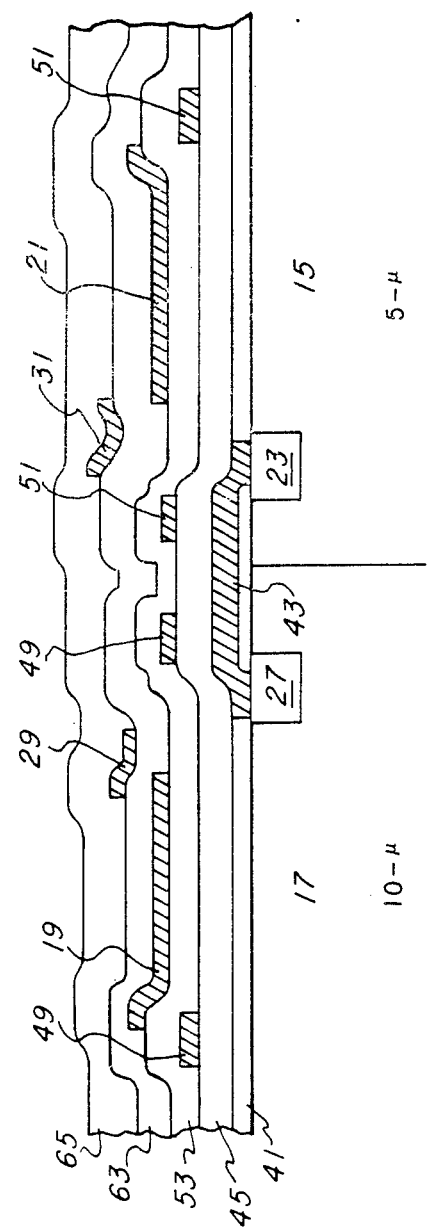

The fabrication of the CIM is completed as follows. The polished two color substrate 18 previously described (FIG. 2d) is processed to yield the detectors shown in FIGS. 6A and B. FIG. 6A is a plan view, and FIG. 6B is a cross section along line B—B of FIG. 6A. First, diodes 27 and diode lines 23 are formed by a boron ion implantation into the surface of the polished substrate 18. Next, a layer 41 of anodic oxide is grown to a thickness of about 70 nm on the surface. Diodes 27 are then connected to the corresponding diode lines 23 by standard patterning and metallization 43. Next a layer 45 of ZnS is deposited by evaporation to a thickness of approximately 200 nm. Field plates 49 and 51 are then formed by metallization and are opaque to infrared. These field plates are to compensate for the trapped positive charge caused by the anodic oxidation; this is a problem because of the P-type material being used for substrate 18. In particular, trapped positive charge in the anodic oxide well cause electrons to accumulate at the interface of the oxide and the bulk HgCdTe; and these electrons will readily flow into the potential wells 22 formed below the detector gates and swamp any photo-generated electrons being collected. This will be discussed in the operation of array 11 below. Next, another layer 53 of ZnS is run by evaporation to a thickness of approximately 100 nm. On this last layer 53 detector gates 19 and 21 are formed of thin nickel so as to be transparent to infrared, and the gates are row connected, the gates over the ten micron HgCdTe are connected by bus 59 and the gates 21 over the five micron HgCdTe are connected by bus 61. Detector gates 19 and 21 may be 6 nm thick and about 50 microns square, which may give a center-to-center separation of 70–80 microns for the detectors. Another ZnS layer 63 is deposited by evaporation to a thickness of approximately 400 nm; and this is followed by metallizations forming transfer gates 29 and 31 which are opaque to infrared. A final ZnS layer 65 is grown to a thickness of approximately 500 nm.

The complete (except for field plates) two-color array in plan view would look like FIG. 4B with each diode line 23 also having ten micron detector gates 19, diodes 27, transfer gates 29, etc. along its left side, as shown in FIG. 6A for a single pair of five micron and ten micron detectors.

The operation of array 11 can now be described, but for simplicity only one color operation is illustrated in FIGS. 7 and 8 with FIG. 7 showing energy levels and FIG. 8 being a timing diagram. First, the detector gates of row M are biased either by a ramped voltage (as shown in FIG. 8a) for tunnel breakdown control or by a pulse voltage to form potential wells underneath detector gates 19 or 21. Infrared photo-generated (and dark current) charge begins collecting in the potential wells (FIG. 7(b)–(d). Diodes 23 and 27 are then preset to a reverse bias voltage by applying a reset pulse through external MOSFET switches (FIG. 8(e)). A clamp pulse applied to the external electronics sets the output signal to the actual voltage level thus established on each diode (FIG. 8(c)). The detector gate bias is abruptly reduced on the addressed row, collapsing the potential well beneath the N/2 detector gates and transferring each collected charge packet to its associated diode (FIGS. 7(e) and 8(a)). The appropriate transfer gate (transfer gates 29 for detector gates 19 and transfer gates 31 for detector gates 21) is dc-biased just past the threshold to allow charge to pass into the appropriate diode as the potential well collapses.

Figure 7A:
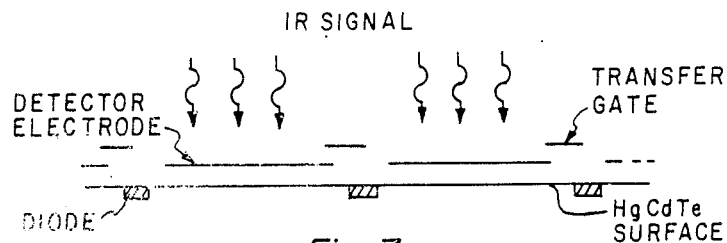
FIG. 7 schematically shows the energy level during operation of the array.
Figure 7B:
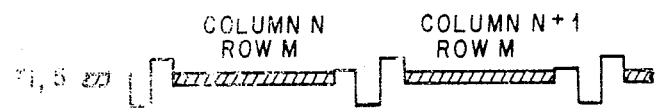
Figure 7C:
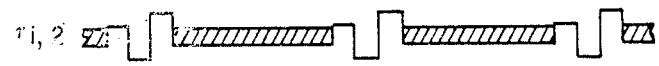
Figure 7D:
Figure 7E:
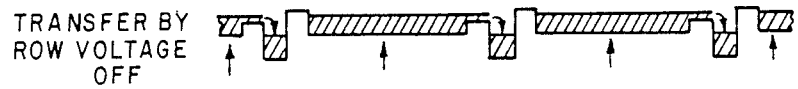
Figure 7F:
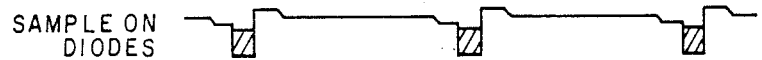
Figure 7G:
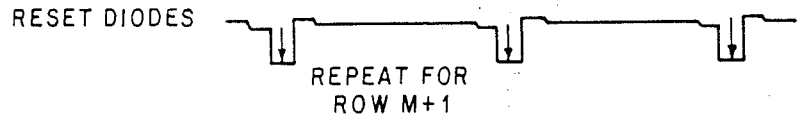
Figure 8A:
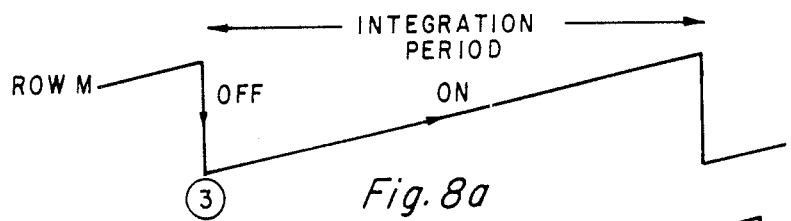
FIG. 8 is a timing diagram for operation of the array.
Figure 8B:
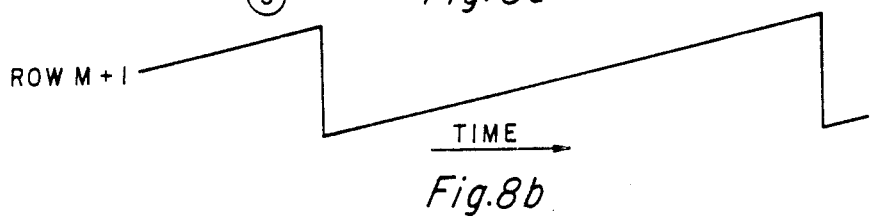
Figure 8C:
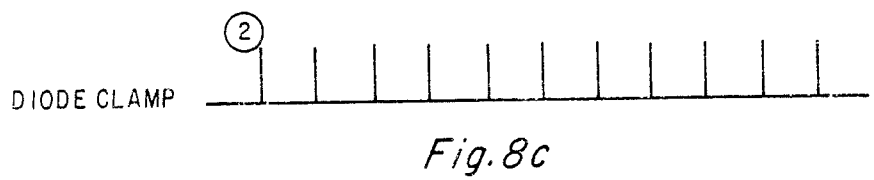
Figure 8D:
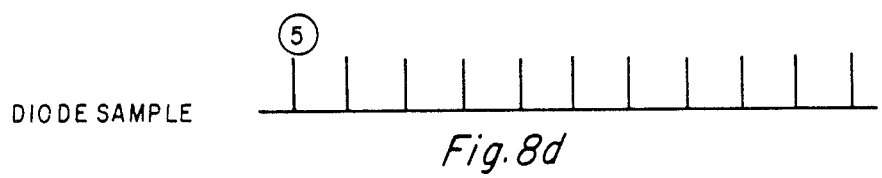
Figure 8E:
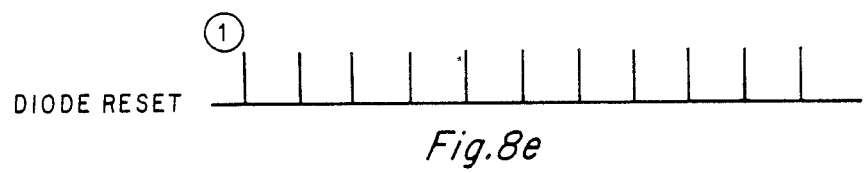
Figure 8F:
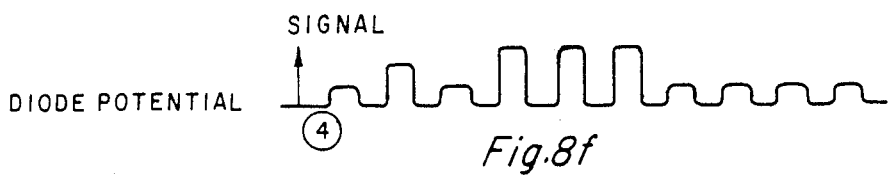
Figure 8G:
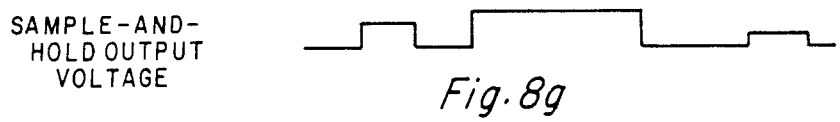

The voltage on diode 23 changes according to the quantity of signal charge transferred to the diode divided by the node capacitance on the diode drainline (FIGS. 7(f) and 8(f)). The voltages on the diodes are then sampled (FIG. 8(d)) and held in external circuits. To initiate the next read cycle, the ramped voltage is reapplied to the row just sampled, and those detectors begin to integrate signals (collect photo-generated charge and dark current) for the next integration period. Diodes 23 or 27 are again preset before output of the next row of collected charge packets (FIGS. 7(g) and 8 (b), (e)). This process continues throughout the field of scan.

Note that presetting the output diodes 23 and 27 actually reverse biases them to a given reference potential. In doing so, the charge transferred onto the diodes during the read process is conducted from array 11. The main restriction on the diode is that it must not become forward-biased during the read cycle. Finally, it is only the charge transferred onto the diode between the clamp and sample pulses that generate a signal in the external circuits. Because of the differential nature of this output scheme, the output voltages are practically immune to threshold level changes in the HgCdTe.

Since diodes 23 and 27 are operated as floating diodes the initial potential was preset to a small reverse bias (0.1 to 0.2 V) through a silicon NMOS transistor and then allowed to float. A silicon source-follower amplifier continuously monitors the diode potential. The output of the source-follower amp is fed to a low-noise voltage mode preamplifier, and after amplification, to a correlated double-sampling amplifier referred to as a clamp/sample and hold (CSH) amplifier. The preset transistor, source-follower, preamplifier, and CSH amplifier may be outside of the cryogenic container of array 11. Typically, each detector collects charges for approximately 25 microseconds and within one to two micronseconds after the collected charge is transferred to the diode, the diode voltages is sampled, amplified, and held until the next sample. Field plates 49 and 51 may be biased near flatband or slightly accumulated.

The electronic addressing in array 11 provides flexibility in output. For example, in a time delay and integrate (TDI) mode of operation, as array 11 is scanned either an entire frame of one color may be read out or both colors may be read out in alternation. Further, multiple samples per dwell (for each detector), variable row address rates, and oversampling in the cross-seam direction are possible with array 11.

In the event that diode 23 must be more strongly biased than diodes 27 to read the collected charge, it is possible that diodes 27 may be driven into breakdown. In such a case, the geometry of array 11 can be modified in various ways to avoid such breakdown. For example, the 5 micron and 10micron HgCdTe regions 15 and 17 can be isolated from each other by growing them in alternating slots in substrate 13, which is semi insulating CdTe, and biasing 10 micron region 17 through the substrate 13 connection during the read biasing of diodes 23 and thereby eliminate any bias on diodes 27. Alternatively, pairs of parallel diode lines 23' can be substituted for diode lines 23 of array 11, and one diode line 23' of each pair is connected to diodes 27 while the other diode of the pair is used to collect change from the five micron MIS. The two diode lines 23' of each pair are connected by a diode transfer gate, and biasing the diode transfer gate during reading of the five micron MIS collected charge can be used to reduce the bias on diodes 27.

Variations of the described preferred embodiment array 11 include use of materials other than HgCdTe, use of n-type substrate and epi layers, use of three or more color sensitivities, use of the detectors of one color larger than those of another color (e.g., in FIG. 6A gate 19 could be a rectangle with long horizontal sides extending to the left), and use of alternative patterns of the two or more detector types.

We claim:

1. A focal plane array, comprising:
   (a) a body with a first surface,
   (b) said body including regions of a first semiconductor material having photosensitivity in a first predetermined spectral band and extending to said first surface,
   (c) said body including regions of a second semiconductor material different from said first semiconductor material and having photosensitivity in a second predetermined spectral band different from said first predetermined spectral band and extending to said first surface,
   (d) said regions of said first material and said regions of said second material being disposed adjacent each other,
   (e) a first plurality of gates, each of said first plurality of gates including a metal electrode and an insulating layer between said electrode and one of said regions, each of said gates of said first plurality positioned over said one of said regions of said first material and forming an MIS photodetector therewith,
   (f) a second plurality of gates, each of said second plurality of gates including a metal electrode and an insulating layer between said electrode and the other of said regions, each of said gates of said second plurality positioned over said the other of said regions of said second material and forming an MIS photodetector therewith, and
   (g) a plurality of electrical conduction lines in said body, each of said MIS photodetectors adjacent but separated from at least one of said conduction lines, each said line being coupled to one of said regions.

2. The array of claim 1, wherein:
   (a) said first and second materials are doped p-type, and
   (b) said conduction lines are n-type where they intersect said regions of said p-type materials.

3. The array of claim 2, wherein:
   (a) said conduction lines comprise (i) n-type lines in said p-type first material, (ii) small regions of n-type in said p-type second material, and (iii) electrical connections from said n-type regions to said n-type lines.

4. The array of claim 2, wherein:
   (a) said first and second materials are alloys of mercury, cadmium and tellurium.

5. The array of claim 2, wherein:
   (a) each of said MIS photodetectors formed by said first plurality of gates and regions of said first material is within 500 microns of at least one of said MIS photodetectors formed by said second plurality of gates and regions of said second material.

6. The array of claim 1, wherein:
   (a) said MIS photodetectors are arranged into rows and columns on said first surface.

7. The array of claim 6, further comprising:
   (a) a plurality of electrical conduction lines, each of said conduction lines between columns of said MIS photodetectors,
   (b) a first plurality of busses, each of said busses electrically interconnecting the gates of said first plurality which are in one of said rows, and
   (c) a second plurality of busses, each of said busses electrically interconnecting the gates of said second plurality which are in one of said rows.

8. The array of claim 7, wherein:
   (a) said first and second materials are doped p-type and,
   (b) each of said conduction lines comprises (i) an n-type line in said first p-type material, (ii) at least one small n-type region in said second p-type material regions, and (iii) electrical connections between said n-type regions and said n-type line.

9. The array of claim 7, wherein:
   (a) said first and second materials are doped p-type and
   (b) each of said conduction lines comprises (i) a first n-type line in said first p-type material, (ii) a second n-type line in said first p-type material, and connected to said first n-type line by a transfer gate, (iii) at least one small n-type region in said second p-type material regions, and (iv) electrical connections between said n-type regions and said second n-type line.

10. The array of claim 1, wherein:
    (a) said regions of said first material and said regions of said second material are separated from each other in said body.

11. A two color infrared focal plane array, comprising:
    (a) a semiconductor body having a planar surface;
    (b) a first set of parallel columns in said body at said surface of a semiconductor material having a first predetermined band gap;
    (c) a second set of columns parallel to said first set of columns in said body at said surface of a semiconductor material with a second predetermined band gap and with each column of said second set abutting a column of said first set;
    (d) said first band gap being larger than said second band gap, said first band gap being approximately equal to the energy of a photon of a first infrared color and said second band gap being approximately equal to the energy of a photon of a second infrared color;
    (e) a plurality of conductive first gates insulated from said surface, each of said first gates being over a region within one of said columns of said first set, and said first gates being connected together in rows, each of said rows being substantially perpendicular to said columns;
    (f) a plurality of conductive second gates insulated from said surface, each of said second gates being over a region within one of said columns of said second set, and said second gates being connected together in rows, each of said rows being substantially perpendicular to said columns;

(g) a diode line in each of said columns of said first set, said diode line being adjacent but not abutting said regions under said first gates within one of said columns of said first set;

(h) a plurality of diodes in each of said columns of said second set, said diodes each being adjacent but not abutting one of said regions under said second gates;

(i) a plurality of electrical connections, one of said connections for each of said diodes in a column of said second set and connecting said diode to the one of said diode lines in said abutting column of said first set;

(j) a plurality of first transfer gates insulated from said surface, each of said first transfer gates being in one of said columns of said first set and located to control the potential between the diode line in said column and the adjacent regions; and (k) a plurality of second transfer gates insulated from said surface, each of said second transfer gates being in one of said columns of said second set and located to control the potential between each of the diodes in said column and its adjacent region.

12. The array of claim 11, wherein:
(a) said first band gap material is $Hg_{1-x}Cd_xTe$; and
(b) said second band gap material is $Hg_{1-y}Cd_yTe$ with $y<x$.

13. The array of claim 11, wherein:
(a) said first band gap material is doped p type;
(b) said second band gap material is doped p type;
(c) said diode lines are n type; and
(d) said diodes are n type.

* * * * *